US010301742B2

(12) United States Patent
Kajigaya

(10) Patent No.: US 10,301,742 B2
(45) Date of Patent: *May 28, 2019

(54) LITHIUM NIOBATE SINGLE CRYSTAL SUBSTRATE AND METHOD OF PRODUCING THE SAME

(71) Applicant: SUMITOMO METAL MINING CO., LTD., Tokyo (JP)

(72) Inventor: Tomio Kajigaya, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/572,639

(22) PCT Filed: Jun. 8, 2016

(86) PCT No.: PCT/JP2016/067068
§ 371 (c)(1),
(2) Date: Nov. 8, 2017

(87) PCT Pub. No.: WO2016/204041
PCT Pub. Date: Dec. 22, 2016

(65) Prior Publication Data
US 2018/0135205 A1      May 17, 2018

(30) Foreign Application Priority Data

Jun. 18, 2015 (JP) ................................. 2015-123188

(51) Int. Cl.
| | | |
|---|---|---|
| *C30B 29/00* | (2006.01) | |
| *C30B 29/30* | (2006.01) | |
| *C01G 33/00* | (2006.01) | |
| *C30B 15/04* | (2006.01) | |
| *C30B 33/02* | (2006.01) | |
| *C30B 15/00* | (2006.01) | |

(52) U.S. Cl.
CPC .............. *C30B 29/30* (2013.01); *C01G 33/00* (2013.01); *C01G 33/006* (2013.01); *C30B 15/00* (2013.01); *C30B 15/04* (2013.01); *C30B 33/02* (2013.01); *C01P 2006/40* (2013.01); *C01P 2006/80* (2013.01)

(58) Field of Classification Search
CPC ... C01G 33/006; C01G 33/02; C01P 2006/80; C01P 2006/40; C30B 29/30; C30B 15/04
USPC ..................................................... 423/594.8
See application file for complete search history.

(56) References Cited

U.S. PATENT DOCUMENTS

| 5,482,001 | A | * | 1/1996 | Katoono | ................. C30B 29/30 |
|---|---|---|---|---|---|
| | | | | | 117/4 |
| 5,904,912 | A | * | 5/1999 | Kitamura | ................. C30B 15/00 |
| | | | | | 423/594.8 |
| 2005/0145165 | A1 | | 7/2005 | Kajigaya | |
| 2005/0284359 | A1 | | 12/2005 | Hotta | |
| 2009/0230817 | A1 | | 9/2009 | Kurachi | |

FOREIGN PATENT DOCUMENTS

| JP | H11-092147 A | 4/1999 |
|---|---|---|
| JP | 2005-179177 A | 7/2005 |
| JP | 2005-314137 A | 11/2005 |
| JP | 2007046176 A1 | 4/2007 |
| JP | 2008-301066 A | 12/2008 |
| JP | 2015-098410 A | 5/2015 |

OTHER PUBLICATIONS

Y. Cho, et al.; "Surface Acoustic Wave Paramagnetic Resonance in Iron Doped-LiNbO3;" Japanese Journal of Applied Physics; vol. 29; Supplement 29-1; 1990; pp. 19-21 (3 Sheets)/Cited in International Search Report.

E Gamaly, et al.; "Three-dimensional write-read-erase memory bits by femtosecond laser pulses in photorefractive LiNbO3 crystals;" Current Applied Physics; vol. 8; Issues 3-4; Nov. 4, 2007; pp. 416-419 (4 Sheets)/Cited in International Search Report.

International Search Report for International Application No. PCT/JP2016/067068 dated Aug. 30, 2016.

* cited by examiner

*Primary Examiner* — Steven J Bos
(74) *Attorney, Agent, or Firm* — Kratz, Quintos & Hanson, LLP

(57) ABSTRACT

To provide a lithium niobate (LN) substrate which allows treatment conditions regarding a temperature, a time, and the like to be easily managed and in which an in-plane distribution of a volume resistance value is very small, and a method of producing the same.

A method of producing an LN substrate by using an LN single crystal grown by the Czochralski process, in which an LN single crystal having a Fe concentration of 50 mass ppm or more and 1000 mass ppm or less in the single crystal and processed into a form of a substrate is buried in an Al powder or a mixed powder of Al and $Al_2O_3$, and heat-treated at a temperature of 350° C. or more and less than 450° C., to produce a lithium niobate single crystal substrate having a volume resistivity controlled to be within a range of more than $1\times10^{10}$ Ω·cm to $2\times10^{12}$ Ω·cm or less.

1 Claim, No Drawings

LITHIUM NIOBATE SINGLE CRYSTAL SUBSTRATE AND METHOD OF PRODUCING THE SAME

TECHNICAL FIELD

The present invention relates to a lithium niobate single crystal substrate used in surface acoustic wave devices and the like, and more particularly to improvements in a lithium niobate single crystal substrate that is unlikely to cause a decrease in yield in device fabrication processes, and a method of producing the same.

BACKGROUND ART

Lithium niobate ($LiNbO_3$: hereinafter, abbreviated as LN) single crystals are artificial ferroelectric crystals having a melting point of approximately 1250° C. and a Curie temperature of approximately 1140° C. In addition, a lithium niobate single crystal substrate (hereinafter, referred to as an LN substrate) made of LN single crystals is utilized as a material for a surface acoustic wave device (SAW filter) used for removing noises from electrical signals used mainly in mobile communications devices.

The SAW filter has a structure in which a comb electrode is formed of a metal thin film of an AlCu alloy or the like on a substrate formed of a piezoelectric material such as an LN single crystal. This comb electrode plays an important role that affects the properties of the device. In addition, the comb electrode is formed by first forming a metal thin film on a piezoelectric material by a sputtering method or the like, and then etching and removing an unnecessary portion while leaving a comb pattern by a photolithographic technique.

In addition, the LN single crystal, serving as the material for the SAW filter, is industrially obtained by the Czochralski process, in which the LN single crystal is generally grown in an electric furnace having an atmosphere of a nitrogen-oxygen mixed gas in which the concentration of oxygen is approximately 20% by using a platinum crucible, and then cooled at a predetermined cooling rate in the electric furnace, and thereafter taken out of the electric furnace.

The LN single crystal thus grown is colorless and transparent or takes on a pale yellow color with a high transparency. After the growth, to remove residual strain due to the thermal stress during the growth, the LN single crystal is subjected to heat treatment under soaking at a temperature close to its melting point, and is subjected to poling treatment for obtaining single polarity, that is, to a series of treatments in which the temperature of the LN single crystal is increased from room temperature to a predetermined temperature of the Curie temperature or more, a voltage is then applied to the single crystal, and the temperature of the LN single crystal is decreased to a predetermined temperature of the Curie temperature or less while keeping applying the voltage, thereafter, the application of the voltage is stopped, and the LN single crystal is cooled down to room temperature. After the poling treatment, the LN single crystal (ingot), which has been abraded on its peripheral surface in order to adjust the external shape of the single crystal, undergoes machining such as slicing, lapping, and polishing steps to become an LN substrate. The substrate finally obtained is substantially colorless and transparent, and has a volume resistivity of approximately $1 \times 10^{15}$ Ω·cm or more.

The LN substrate obtained by such a conventional method has a problem of pyroelectric breakdown in the process of manufacturing the SAW filter. The pyroelectric breakdown is a phenomenon in which due to the pyroelectric property, which is a property of the LN single crystal, electrical charge is charged up on the surface of the LN substrate because of the change in temperature applied by the process, and generates sparks, which cause the comb electrode formed on the surface of the LN substrate to broken, and further cause crack and the like to be generated in the LN substrate. The pyroelectric breakdown is a major factor of causing a decrease in yield in the device fabrication process. In addition, the high light transmittance of the substrate causes also a problem that light transmitted through the substrate in the photolithographic process, which is one of the device fabrication processes, is reflected at the back surface of the substrate to return the front surface, causing the resolution of the formed pattern to deteriorate.

In view of this, to solve this problem, Patent Document 1 proposes a method in which an LN substrate is exposed to a chemical reducing atmosphere of a gas selected from argon, water, hydrogen, nitrogen, carbon dioxide, carbon monoxide, and oxygen, as well as combinations of these at a temperature within a range of 500 to 1140° C. to be blackened to lower the resistance value of the LN substrate, thereby reducing the pyroelectric property. Note that performing the above-described heat treatment causes the LN crystal, which has been colorless and transparent, to become colored and opaque. Since the color tone of the colored and opaque crystal then observed looks brown to black with a transmitted light, the phenomenon in which a crystal becomes colored and opaque is herein referred to as "blackening". It is considered that the blackening phenomenon occurs because oxygen defects (voids) are introduced into the LN substrate by the reduction treatment and a color center is thus formed. It is considered that the change in resistance value occurs because the valence of Nb ions changes from 5+ to 4+ and free electrons emitted from Nb ions increase in the substrate to compensate for deviation of the charge balance due to the generation of oxygen defects. Accordingly, the degree of blackening and the resistance value are substantially proportional to each other.

Meanwhile, since the method described in Patent Document 1 includes heating the LN substrate (crystal) to a high temperature of 500° C. or more, the treatment time is short; however, variations are likely to occur in blackening between treatment batches. In addition, color non-uniformity due to the blackening, that is, in-plane distribution of resistivity is likely to occur in the heat-treated substrate. Thus, there is a problem that a decrease in yield in the device fabrication process still cannot be sufficiently prevented.

For this reason, as a method to solve the above-described problems, Patent Document 2 proposes a method in which an LN substrate (crystal) is heat-treated at a low temperature of 300° C. or more and less than 500° C. in a state where the LN substrate (crystal) is buried in a powder formed of at least one element selected from the group consisting of Al, Ti, Si, Ca, Mg, and C.

CONVENTIONAL ART DOCUMENTS

Patent Documents

Patent Document 1: Japanese Patent Application Publication No. 11-92147

Patent Document 2: Japanese Patent Application Publication No. 2005-179177

SUMMARY OF THE INVENTION

Problem to be Solved by the Invention

In addition, the method described in Patent Document 2 has been a method that is surely capable of providing an LN substrate in which color non-uniformity due to blackening, that is, in-plane distribution of volume resistivity is small and the pyroelectric property is suppressed, by using a simple device because the treatment temperature is as low as less than 500° C.

However, since the LN single crystal (having a melting point of 1250° C.) has such a property as to be more easily reduced than a lithium tantalate single crystal (having a melting point of 1650° C.) which is also utilized in the SAW filter, a slight change in treatment conditions largely affects the volume resistivity of the LN crystal (substrate) after the treatment even when the reduction treatment is conducted at a low temperature of less than 500° C. For this reason, in the method described in Patent Document 2, it is required that treatment conditions regarding a temperature, a time, and the like be strictly managed. Moreover, even when the treatment is conducted under strictly managed conditions, there is a likelihood that color non-uniformity due to blackening, which is slight though, that is, in-plane distribution of volume resistivity occur. Thus, there is still room for further improvements in the method described in Patent Document 2.

The present invention has been made with focus on such problems, and an object thereof is to provide an LN substrate which make it possible to ease the management of treatment conditions regarding a temperature, a time, and the like, and in which color non-uniformity due to blackening, that is, in-plane distribution of volume resistance value is very small, and a method of producing the same.

Means for Solving the Problems

In view of this, the present inventors grew an LN single crystal containing a trace of Fe and attempted experiments of reducing the LN single crystal.

According to this, the present inventors confirmed that the LN crystal (substrate) containing Fe had a property that it was less likely to be reduced than an LN crystal (substrate) not containing Fe, and further found that the higher the content of Fe contained in the crystal is, the less likely the LN crystal (substrate) is to be reduced substantially in proportion. The present invention has been completed based on such findings.

Specifically, a first aspect of the present invention is a lithium niobate single crystal substrate, wherein
a volume resistivity of the lithium niobate single crystal substrate is controlled to be within a range of more than $1 \times 10^{10}$ Ω·cm to $2 \times 10^{12}$ Ω·cm or less, and
a Fe concentration in a lithium niobate single crystal is 50 mass ppm or more and 1000 mass ppm or less.

In addition, a second aspect of the present invention is a method of producing a lithium niobate single crystal substrate by using a lithium niobate single crystal grown by the Czochralski process, wherein
a lithium niobate single crystal having a Fe concentration of 50 mass ppm or more and 1000 mass ppm or less in the single crystal and processed into a form of a substrate is buried in an Al powder or a mixed powder of Al and $Al_2O_3$, and heat-treated at a temperature of 350° C. or more and less than 450° C., to produce a lithium niobate single crystal substrate having a volume resistivity controlled to be within a range of more than $1 \times 10^{10}$ Ω·cm to $2 \times 10^{12}$ Ω·cm or less.

Next, a third aspect of the present invention is the method of producing a lithium niobate single crystal substrate described in the second aspect, wherein
an arithmetic average roughness Ra of a surface of the lithium niobate single crystal processed into the form of the substrate is 0.2 μm or more and 0.4 μm or less.

A fourth aspect of the present invention is the method of producing a lithium niobate single crystal substrate described in the second aspect or the third aspect, wherein
the heat treatment is conducted in a vacuum atmosphere or in a reduced-pressure atmosphere of an inert gas.

Moreover, a fifth aspect of the present invention is the method of producing a lithium niobate single crystal substrate described in the second aspect, the third aspect, or the fourth aspect, wherein
the heat treatment is conducted for 1 hour or more.

EFFECTS OF THE INVENTION

According to the lithium niobate single crystal substrate of the first aspect, since the Fe concentration in the lithium niobate single crystal is 50 mass ppm or more and 1000 mass ppm or less, the volume resistivity after the reduction treatment is stably controlled to be within the range of more than $1 \times 10^{10}$ Ω·cm to $2 \times 10^{12}$ Ω·cm or less.

In addition, according to the method of producing a lithium niobate single crystal substrate of the second aspect to the fifth aspect, since a lithium niobate single crystal having a Fe concentration of 50 mass ppm or more and 1000 mass ppm or less in the single crystal and processed into the form of a substrate is buried in an Al powder or a mixed powder of Al and $Al_2O_3$, and heat-treated at a temperature of 350° C. or more and less than 450° C., it is possible to stably produce a lithium niobate single crystal substrate in which a volume resistivity after the reduction treatment is controlled to be within a range of more than $1 \times 10^{10}$ Ω·cm to $2 \times 10^{12}$ Ω·cm or less and an in-plane distribution of the volume resistivity is also small.

MODES FOR PRACTICING THE INVENTION

The present invention is described below in detail.
(1) Volume Resistivity and Pyroelectric Effect (Pyroelectric Property) of LN Single Crystal The LN single crystal changes in volume resistivity and color (light transmittance spectrum) in accordance with the concentration of oxygen defects present in the crystal. Specifically, once oxygen defects are introduced into the LN single crystal, the valence of part of Nb ions changes from 5+ to 4+ due to the necessity of compensating for the charge balance due to the defects of oxygen ions with a valence of -2, causing the volume resistivity to change. In addition, a color center attributable to the oxygen defects is generated to cause absorption of light.

The change in volume resistivity is considered to occur because electrons, which are carriers, migrate between $Nb^{5+}$ ions and $Nb^{4+}$ ions. The volume resistivity of the crystal is determined by the product of the number of carriers per unit volume and the mobility of the carriers. If the mobility is the same, the volume resistivity is proportional to the number of oxygen voids. Color change due to the absorption of light is considered to be caused by a color center which is formed due to electrons in a metastable state captured in oxygen defects.

The above-described control on the number of oxygen voids may be conducted by so-called heat treatment in atmosphere. The concentration of oxygen voids in the crystal placed at a specific temperature changes in a manner of coming into equilibrium with the oxygen potential (oxygen concentration) of the atmosphere in which the crystal is placed. If the oxygen concentration of the atmosphere becomes lower than the equilibrium concentration, the concentration of oxygen voids in the crystal increases. In addition, increasing the temperature with a constant oxygen concentration of the atmosphere allows the concentration of oxygen voids to increase even when the oxygen concentration of the atmosphere is made lower than the equilibrium concentration. Accordingly, to make the concentration of oxygen voids higher to enhance the opacity, the temperature may be set higher and the oxygen concentration of the atmosphere may be made lower.

Since the LN single crystal has a strong ion-binding property, the voids disperse at a relatively high speed. However, the change in the concentration of oxygen voids requires the in-crystal dispersion of oxygen, and hence, the crystal needs to be retained in the atmosphere for a certain period of time. This speed of dispersion depends greatly on the temperature, and the concentration of oxygen voids does not change in an actual period of time at near room temperature. Accordingly, to obtain an opaque LN crystal in a short period of time, the crystal needs to be retained in an atmosphere having a low oxygen concentration at a temperature that allows a sufficient oxygen dispersion speed to be achieved. Cooling down the crystal promptly after the treatment allows the crystal in which the concentration of oxygen voids introduced at a high temperature is maintained to be obtained at room temperature.

Here, the pyroelectric effect (pyroelectric property) is attributable to the deformation of lattice caused by change in temperature of the crystal. It is understood that in a crystal having electric dipoles, the pyroelectric effect occurs because the distance between the dipoles changes depending on the temperature. The pyroelectric effect occurs only in materials having high electrical resistances. The displacement of ions causes an electrical charge in the dipole direction on the surface of the crystal. However, in a material having a low electrical resistance, this electrical charge is neutralized because of the electrical conductivity possessed by the crystal itself. Since a normal transparent LN single crystal has a volume resistivity at the level of $1\times10^{15}$ $\Omega\cdot cm$ as described above, the pyroelectric effect is markedly exhibited. However, a blackened opaque LN single crystal has a volume resistivity significantly decreased by several orders of magnitude, and accordingly, the electrical charge is neutralized within a very short period of time, so that the pyroelectric property is no longer exhibited.

(2) Method of Producing LN Substrate According to the Present Invention

The method described in Patent Document 1, which aims to decrease the pyroelectric property of an LN substrate, has problems that since the LN substrate is heated to a high temperature of 500° C. or more as described above, although the treatment time is short, variations are likely to occur in blackening between treatment batches, and color non-uniformity due to the blackening, that is, in-plane distribution of resistivity occurs in the heat-treated substrate.

In addition, the method described in Patent Document 2, which aims to solve the problems of Patent Document 1, is a method that makes it possible to provide an LN substrate in which color non-uniformity due to blackening, that is, in-plane distribution of volume resistivity is small and the pyroelectric property is suppressed, because the treatment temperature is as low as less than 500° C.

Nonetheless, since the LN single crystal (having a melting point of 1250° C.) has such a property as to be more easily reduced than a lithium tantalate single crystal (LT single crystal), which has a melting point of 1650° C., and a slight change in treatment conditions affects the volume resistivity of the LN substrate after the treatment, the method described in Patent Document 2 requires that the treatment conditions be strictly managed and there is still room for further improvements.

In the meantime, the results of experiments conducted by the present inventors revealed that the reducibility (reduction easiness) of the LN single crystal is decreased (made difficult to be reduced) by adding a trace of Fe into the crystal, and the reducibility of the LN single crystal is further decreased as the content of Fe increases.

Specifically, the method of producing an LN substrate according to the present invention has been made with attention to the above-described reducibility of the LN single crystal, and is characterized in that the method produces an LN substrate having a volume resistivity controlled to be within a range of more than $1\times10^{10}$ $\Omega\cdot cm$ to $2\times10^{12}$ $\Omega\cdot cm$ or less by heat-treating an LN single crystal (LN substrate) having a Fe concentration of 50 mass ppm or more and 1000 mass ppm or less in the single crystal and processed into a form a substrate in a reducing atmosphere.

Note that the LN substrate to be heat-treated is preferably a substrate obtained by processing an LN single crystal after a poling treatment.

In addition, the heat treatment on the LN substrate to which a trace of Fe has been added is conducted by using a metal Al powder having a low free energy of oxide formation in order to promote the reduction reaction at a low temperature. Specifically, the LN substrate to which a trace of Fe has been added is buried in a metal Al powder or a mixed powder of a metal Al powder and an $Al_2O_3$ powder, and is heat-treated. Here, the heating temperature for the LN substrate is 350° C. or more and less than 450° C. Note that since a higher heating temperature causes the blackening to progress in a shorter period of time, a preferable temperature is within a range from 380° C. to less than 400° C. In addition, the atmosphere for the heat treatment is preferably vacuum or an inert gas (such as a nitrogen gas or an argon gas), and the treatment time is preferably 1 hour or more. Further, the arithmetic average roughness Ra of the surface of the LN substrate is preferably set at 0.2 μm or more and 0.4 μm or less in order to increase the surface area of the LN substrate to promote its reduction reaction.

Moreover, as the most preferable conditions with the controllability of the treatment step, the properties of the finally obtained substrate, the uniformity of these properties, the reproducibility, and the like taken into consideration, it is effective to use an LN substrate cut out of an LN crystal ingot after poling treatment, to bury the LN substrate in a mixed powder of Al and $Al_2O_3$, and to perform the heat treatment in an atmosphere of an inert gas such as a nitrogen gas or an argon gas or in an atmosphere like vacuum. Note that the vacuum atmosphere is more desirable than the inert gas atmosphere because the vacuum atmosphere allows the blackening treatment of the LN substrate in a relatively shorter period of time.

(3) Method of Judging the Effect of the "Heat Treatment" according to the Present Invention As a practical method of judging the effect of the "heat treatment", that is, whether no pyroelectric property is observed in an LN substrate, a heat cycle test in which temperature changes which the LN substrate undergoes are simulated to occur is useful. Specifically, the LN substrate is placed on a hot plate heated to 80° C., and heat cycle is applied to the LN substrate. As a result, in the case of the LN substrate which has not been subjected to the blackening treatment, a high potential of 10 kV or more is generated on the surface of the LN substrate, and sparks are observed. On the other hand, in the case of the LN substrate which has been blackened by the "heat treatment" according to the present invention, the surface potential of the LN substrate is only at the level of up to several hundred V, and the phenomenon of sparking on the surface of the LN substrate is not observed at all. Therefore, the judgment on whether the LN substrate has been blackened or not is useful as a practical method of judging the pyroelectric property.

EXAMPLES

Next, Examples of the present invention are specifically described also by giving Comparative Examples.

Example 1

A Fe-doped LN single crystal having a diameter of 4 inches was grown by the Czochralski process using a raw material having a congruent composition. The growth atmosphere was a nitrogen-oxygen mixed gas having an oxygen concentration of approximately 20%. The concentration of Fe doped in the crystal was set at 50 ppm. The crystal thus obtained was red in color.

This crystal was subjected to the heat treatment for removing the residual thermal strain under soaking and the poling treatment for making it single-polarized. Thereafter, the crystal was abraded on its peripheral surface in order to adjust the external shape of the crystal, and then sliced into an LN substrate.

The LN substrate thus obtained was buried in an Al powder, and was then heat-treated at 400° C. for 20 hours in a vacuum atmosphere.

The LN substrate after the heat treatment was dark green brown in color, had a volume resistivity of approximately $1.5 \times 10^{10}$ $\Omega \cdot cm$, and the variation ($\sigma/Ave$) in volume resistivity in the plane of the substrate was less than 3%. It was also visually observed that color non-uniformity did not occur. Here, Ave is an average value of volume resistivities measured at one point in the center portion and four points on the outer peripheral portion, five points in the surface in total, of the substrate, and $\sigma$ is a standard deviation of these. Note that the volume resistivity was measured by the three-terminal method according to JIS K-6911.

Next, a heat cycle test was conducted in which the LN substrate kept at room temperature was placed on an 80° C. hot plate. As a result, the surface potential generated immediately after the substrate was placed on the hot plate was 110 V or less, and the phenomenon of sparking on the surface of the LN substrate was not observed.

In addition, the LN substrate thus obtained had a Curie temperature of 1140° C., and values of the physical properties that affect the properties of SAW filters were not different from those of conventional products that have not been subjected to the blackening treatment.

Example 2

The heat treatment was conducted under substantially the same conditions as those in Example 1 except that the heat treatment temperature was changed to 350° C.

The LN substrate thus obtained was dark green brown in color, had a volume resistivity of approximately $5 \times 10^{11}$ $\Omega \cdot cm$, and the variation ($\sigma/Ave$) in volume resistivity in the plane of the substrate was less than 3%. It was also visually observed that color non-uniformity did not occur.

In addition, in the heat cycle test, the surface potential generated immediately after the LN substrate was placed on the hot plate was 190 V or less, and the phenomenon of sparking on the surface of the LN substrate was not observed.

Example 3

The heat treatment was conducted under substantially the same conditions as those in Example 1 except that the atmosphere was changed to a nitrogen gas atmosphere.

The LN substrate thus obtained was dark green brown in color, had a volume resistivity of approximately $2.3 \times 10^{10}$ $\Omega \cdot cm$, and the variation ($\sigma/Ave$) in volume resistivity in the plane of the substrate was less than 3%. It was also visually observed that color non-uniformity did not occur.

In addition, in the heat cycle test, the surface potential generated immediately after the LN substrate was placed on the hot plate was 120 V or less, and the phenomenon of sparking on the surface of the LN substrate was not observed.

Example 4

The heat treatment was conducted under substantially the same conditions as those in Example 1 except that the heat treatment time for the LN substrate was changed to 1 hour and the treatment temperature was changed to 445° C.

The LN substrate thus obtained was brown in color, had a volume resistivity of approximately $1 \times 10^{12}$ $\Omega \cdot cm$, and the variation ($\sigma/Ave$) in volume resistivity in the plane of the substrate was less than 3%. It was also visually observed that color non-uniformity did not occur.

In addition, in the heat cycle test, the surface potential generated immediately after the LN substrate was placed on the hot plate was 200 V or less, and the phenomenon of sparking on the surface of the LN substrate was not observed.

Example 5

The heat treatment was conducted under substantially the same conditions as those in Example 1 except that the concentration of Fe doped in the LN crystal was changed to 1000 ppm.

The LN substrate thus obtained was dark green brown in color, had a volume resistivity of approximately $7.7 \times 10^{10}$ $\Omega \cdot cm$, and the variation ($\sigma/Ave$) in volume resistivity in the plane of the substrate was less than 3%. It was also visually observed that color non-uniformity did not occur.

In addition, in the heat cycle test, the surface potential generated immediately after the LN substrate was placed on the hot plate was 150 V or less, and the phenomenon of sparking on the surface of the LN substrate was not observed.

Example 6

The heat treatment was conducted under substantially the same conditions as those in Example 2 except that the concentration of Fe doped in the LN crystal was changed to 1000 ppm.

The LN substrate thus obtained was dark green brown in color, had a volume resistivity of approximately $1.8 \times 10^{12}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 220 V or less, and the phenomenon of sparking on the surface of the LN substrate was not observed.

Example 7

The heat treatment was conducted under substantially the same conditions as those in Example 3 except that the concentration of Fe doped in the LN crystal was changed to 1000 ppm.

The LN substrate thus obtained was dark green brown in color, had a volume resistivity of approximately $1.5 \times 10^{11}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 160 V or less, and the phenomenon of sparking on the surface of the LN substrate was not observed.

Example 8

The heat treatment was conducted under substantially the same conditions as those in Example 7 except that the treatment temperature for the LN substrate was changed to 350° C.

The LN substrate thus obtained was dark green brown in color, had a volume resistivity of approximately $2 \times 10^{12}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 230 V or less, and the phenomenon of sparking on the surface of the LN substrate was not observed.

Example 9

The heat treatment was conducted under substantially the same conditions as those in Example 1 except that the LN substrate was buried in a mixed powder of 10% by mass of Al and 90% by mass of $Al_2O_3$.

The LN substrate thus obtained was dark green brown in color, had a volume resistivity of approximately $1.5 \times 10^{11}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 160 V or less, and the phenomenon of sparking on the surface of the LN substrate was not observed.

Example 10

The heat treatment was conducted under substantially the same conditions as those in Example 2 except that the LN substrate was buried in a mixed powder of 10% by mass of Al and 90% by mass of $Al_2O_3$.

The LN substrate thus obtained was dark green brown in color, had a volume resistivity of approximately $1.5 \times 10^{12}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 210 V or less, and the phenomenon of sparking on the surface of the LN substrate was not observed.

Example 11

The heat treatment was conducted under substantially the same conditions as those in Example 5 except that the LN substrate was buried in a mixed powder of 10% by mass of Al and 90% by mass of $Al_2O_3$.

The LN substrate thus obtained was dark green brown in color, had a volume resistivity of approximately $1 \times 10^{12}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 200 V or less, and the phenomenon of sparking on the surface of the LN substrate was not observed.

Example 12

The heat treatment was conducted under substantially the same conditions as those in Example 3 except that the LN substrate was buried in a mixed powder of 10% by mass of Al and 90% by mass of $Al_2O_3$.

The LN substrate thus obtained was dark green brown in color, had a volume resistivity of approximately $2.3 \times 10^{11}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 170 V or less, and the phenomenon of sparking on the surface of the LN substrate was not observed.

Example 13

The heat treatment was conducted under substantially the same conditions as those in Example 7 except that the LN substrate was buried in a mixed powder of 10% by mass of Al and 90% by mass of $Al_2O_3$.

The LN substrate thus obtained was dark green brown in color, had a volume resistivity of approximately $2 \times 10^{12}$ $\Omega \cdot cm$, and the variation ($\sigma$/Ave) in volume resistivity in the plane of the substrate was less than 3%. It was also visually observed that color non-uniformity did not occur.

In addition, in the heat cycle test, the surface potential generated immediately after the LN substrate was placed on the hot plate was 230 V or less, and the phenomenon of sparking on the surface of the LN substrate was not observed.

Comparative Example 1

A LN single crystal having a diameter of 4 inches was grown by the Czochralski process using a raw material having a congruent composition. The growth atmosphere was a nitrogen-oxygen mixed gas having an oxygen concentration of approximately 20%. The crystal thus obtained was pale yellow in color.

This crystal was subjected to the heat treatment for removing the residual strain under soaking and the poling treatment for making it single-polarized.

Thereafter, the crystal was abraded on its peripheral surface in order to adjust the external shape of the crystal, and then sliced into a substrate.

The LN substrate thus obtained was heat-treated at 600° C. for 1 minute in nitrogen.

The LN substrate after the heat treatment was brown in color, but it was visually observed that color non-uniformity occurred.

As inferred from the fact that color non-uniformity occurred, although the average of measured values of volume resistivity in the plane of the LN substrate was approximately $1 \times 10^{11}$ $\Omega$·cm, there were variations ($\sigma$/Ave) of approximately 30% at some measured spots.

In addition, in the heat cycle test, the surface potential generated immediately after the LN substrate was placed on the hot plate was 150 V or less, and the phenomenon of sparking on the surface of the LN substrate was not observed.

Comparative Example 2

A transparent pale yellow LN single crystal having a diameter of 4 inches was grown in the same manner as in Comparative Example 1, and an LN substrate was produced in the same manner as in Comparative Example 1.

The LN substrate thus obtained was buried in an aluminum (Al) powder, and was then heat-treated at 480° C. for 1 hour in a vacuum atmosphere.

The LN substrate after the heat treatment was brown in color, had a volume resistivity of approximately $1 \times 10^{12}$ $\Omega$·cm, and the variation ($\sigma$/Ave) in volume resistivity in the plane of the substrate was less than 3% as in the case of Examples. It was also visually observed that color non-uniformity did not occur.

Next, a heat cycle test was conducted in which the substrate kept at room temperature was placed on an 80° C. hot plate. As a result, the surface potential generated immediately after the substrate was placed on the hot plate was 200 V or less, and the phenomenon of sparking on the surface of the substrate was not observed.

In the meantime, when an LN substrate is heat-treated, conditions regarding the temperature (480° C.) and the time (1 hour) are strictly managed. When this management was neglected, there was a case where slight color non-uniformity was observed in the LN substrate after the treatment and the variation ($\sigma$/Ave) in volume resistivity in the surface was approximately 10%.

TABLE 1-1

|  | Fe (ppm) | Reducing Agent | Atmosphere | Temperature (° C.) |
|---|---|---|---|---|
| Example 1 | 50 | Al | Vacuum | 400 |
| Example 2 | 50 | Al | Vacuum | 350 |
| Example 3 | 50 | Al | Nitrogen | 400 |
| Example 4 | 50 | Al | Vacuum | 445 |
| Example 5 | 1000 | Al | Vacuum | 400 |
| Example 6 | 1000 | Al | Vacuum | 350 |
| Example 7 | 1000 | Al | Nitrogen | 400 |
| Example 8 | 1000 | Al | Nitrogen | 350 |
| Example 9 | 50 | Al + $Al_2O_3$ | Vacuum | 400 |
| Example 10 | 50 | Al + $Al_2O_3$ | Vacuum | 350 |
| Example 11 | 1000 | Al + $Al_2O_3$ | Vacuum | 400 |
| Example 12 | 50 | Al + $Al_2O_3$ | Nitrogen | 400 |
| Example 13 | 1000 | Al + $Al_2O_3$ | Nitrogen | 400 |
| Comparative Example 1 | — | — | Nitrogen | 600 |
| Comparative Example 2 | — | Al | Vacuum | 480 |

TABLE 1-2

|  | Time (Hour) | Volume Resistivity ($\Omega$·cm) | Surface Potential (V) |
|---|---|---|---|
| Example 1 | 20 | $1.5 \times 10^{10}$ | 110 |
| Example 2 | 20 | $5.0 \times 10^{11}$ | 190 |
| Example 3 | 20 | $2.3 \times 10^{10}$ | 120 |
| Example 4 | 1 | $1.0 \times 10^{12}$ | 200 |
| Example 5 | 20 | $7.7 \times 10^{10}$ | 150 |
| Example 6 | 20 | $1.8 \times 10^{12}$ | 220 |
| Example 7 | 20 | $1.5 \times 10^{11}$ | 160 |
| Example 8 | 20 | $2.0 \times 10^{12}$ | 230 |
| Example 9 | 20 | $1.5 \times 10^{11}$ | 160 |
| Example 10 | 20 | $1.5 \times 10^{12}$ | 210 |
| Example 11 | 20 | $1.0 \times 10^{12}$ | 200 |
| Example 12 | 20 | $2.3 \times 10^{11}$ | 170 |
| Example 13 | 20 | $2.0 \times 10^{12}$ | 230 |
| Comparative Example 1 | 1 min. | $1.0 \times 10^{11}$ | 150 |
| Comparative Example 2 | 1 | $1.0 \times 10^{12}$ | 200 |

[Evaluation]

(1) As acknowledged from the comparison between the volume resistivity ($2.3 \times 10^{10}$ $\Omega$·cm) of the LN substrate according to Example 3 which was heat-treated under substantially the same conditions as those in Example 1 (vacuum atmosphere) except that the atmosphere was changed to a nitrogen gas atmosphere and the volume resistivity ($1.5 \times 10^{10}$ $\Omega$·cm) of the LN substrate according to Example 1 described above, it can be understood that difference in treatment atmosphere does not greatly affect the volume resistivity of an LN substrate containing Fe.

Actually, as compared with the treatment method described in Patent Document 2 (Comparative Example 2), no great change was observed in the variations ($\sigma$/Ave) in volume resistivity in the surfaces of the LN substrates after the treatment even though the heat treatment conditions were not so strictly managed in Examples 1 to 13.

(2) On the other hand, in Comparative Example 2, it was acknowledged that when the management of the above-described heat treatment conditions was neglected, there was a case where the variation ($\sigma$/Ave) in volume resistivity in the plane of the LN substrate after the treatment was approximately 10% as described above.

(3) That is, it is acknowledged that Examples 1 to 13 according to the present invention are superior to the treatment method described in Patent Document 2 (Comparative Example 2).

POSSIBILITY OF INDUSTRIAL APPLICATION

The present invention makes it possible to stably obtain an LN substrate in which a volume resistivity after reduction treatment is controlled to be within a range of more than $1\times10^{10}$ Ω·cm to $2\times10^{12}$ Ω·cm or less, and an in-plane distribution of the volume resistivity is small. Therefore, the present invention has a possibility of industrial application for use as a material for a surface acoustic wave device (SAW filter).

The invention claimed is:

1. A lithium niobate single crystal substrate, wherein
a volume resistivity of the lithium niobate single crystal substrate is within a range of more than $1\times10^{10}$ Ω·cm to $2\times10^{12}$ Ω·cm,
a Fe concentration in the lithium niobate single crystal substrate is 50 mass ppm to 1000 mass ppm, and
the variation (σ/Ave) in volume resistivity in the plane of the lithium niobate single crystal substrate is less than 3%.

* * * * *